United States Patent [19]

Uesugi

[11] Patent Number: 4,763,304

[45] Date of Patent: Aug. 9, 1988

[54] SEMICONDUCTOR RANDOM ACCESS MEMORY DEVICE HAVING SWITCHABLE INPUT AND OUTPUT BIT FORMS

[75] Inventor: Masaru Uesugi, Tokyo, Japan

[73] Assignee: Oki Electric Industry Co., Ltd., Tokyo, Japan

[21] Appl. No.: 882,534

[22] Filed: Jul. 7, 1986

[30] Foreign Application Priority Data

Jul. 8, 1985 [JP] Japan .................... 60-149623

[51] Int. Cl.⁴ .............................................. G11C 7/00
[52] U.S. Cl. .................................... 365/190; 365/230; 365/189
[58] Field of Search ................ 365/230, 189, 233, 190

[56] References Cited

U.S. PATENT DOCUMENTS 4,099,253 7/1978 Dooley, Jr. ................ 365/230
4,354,256 10/1982 Miyasaka .................... 365/189
4,675,849 6/1987 Kinoshita ..................... 365/189

*Primary Examiner*—Stuart N. Hecker
*Assistant Examiner*—Glenn A. Gossage
*Attorney, Agent, or Firm*—Wenderoth, Lind & Ponack

[57] ABSTRACT

A semiconductor random access memory device having input terminals for receiving multi-bit data and output terminals for transmitting multi-bit data includes a memory cell matrix connected to a number of pairs of data lines and including a number of memory cells. Also included is an address decoder circuit which is responsive to an external address signal for providing address selection signals and a number of data input control circuits for receiving both 1-bit data signal and 1-bit signals of the multi-bit data and for providing as a pair of complementary signals either the 1-bit data signal or the one bit signal of the multi-bit data signal in response to various signals input thereto. A number of data input-/output switching circuits and bit data output control circuits and 1-bit data output circuits and bit signal output control circuits are also provided for properly outputting either the 1-bit data or one bit signal of the multi-bit data from the output of the semiconductor random access memory device.

5 Claims, 7 Drawing Sheets

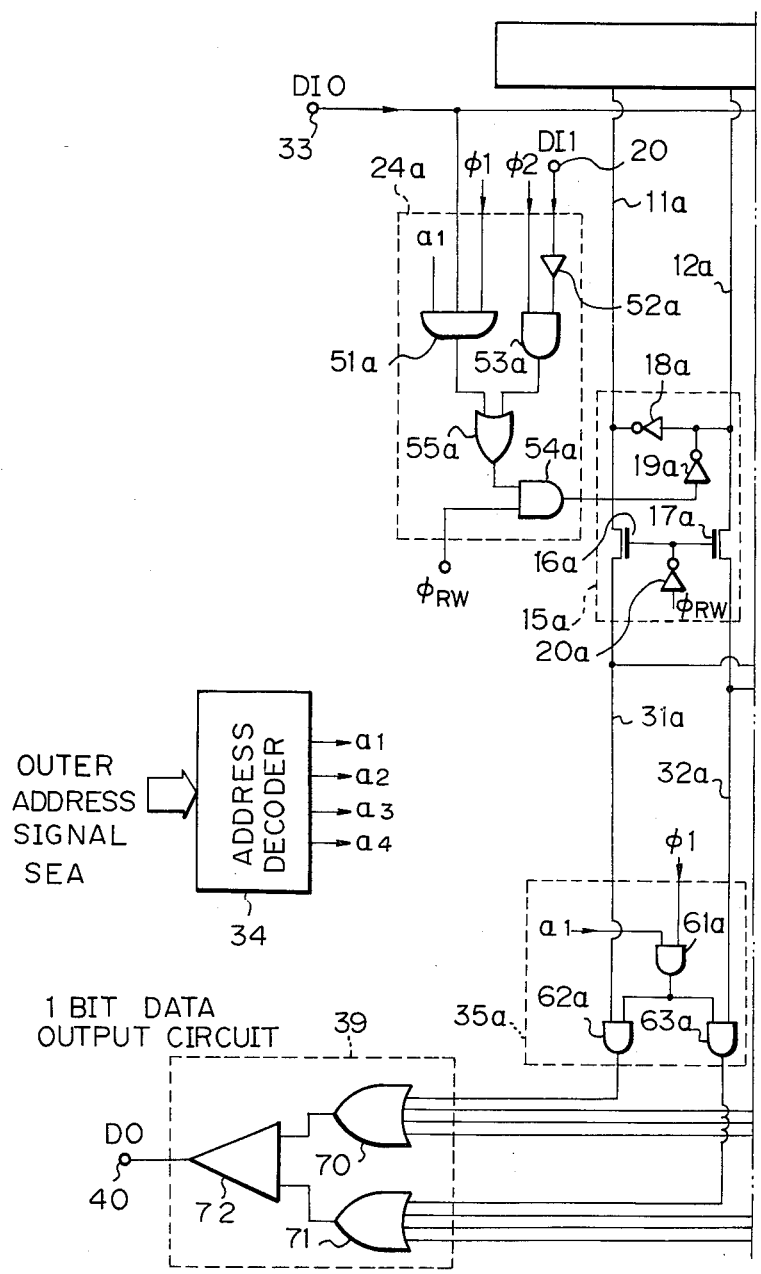

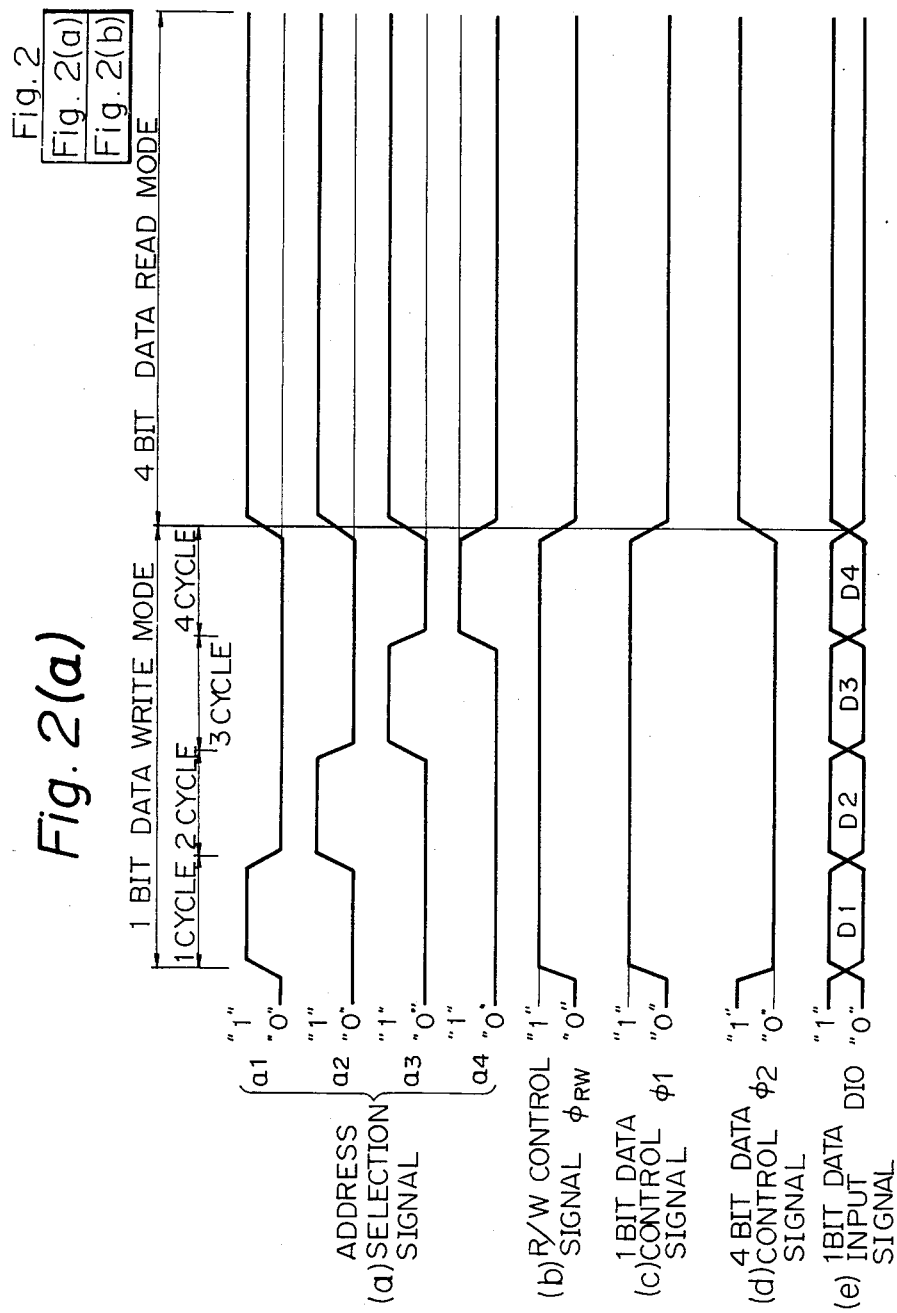

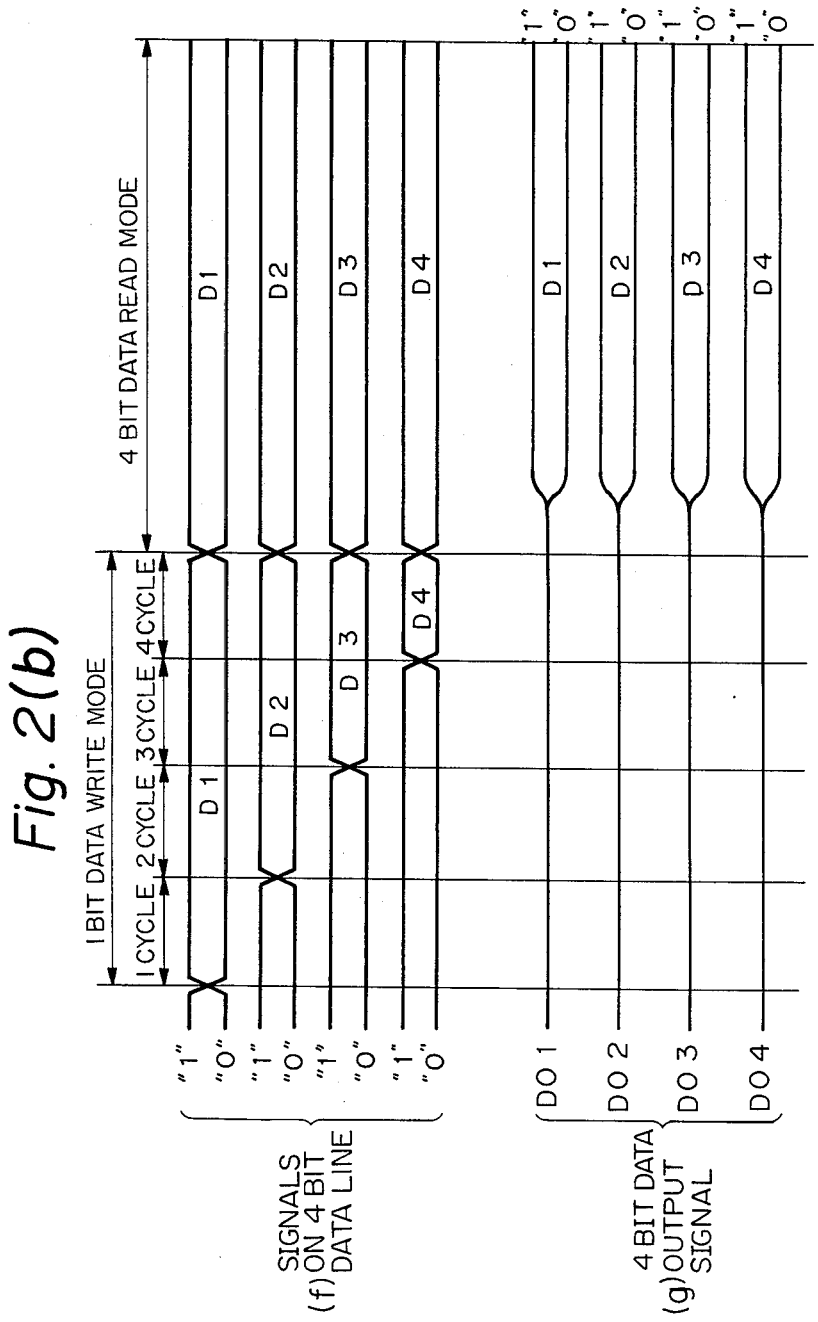

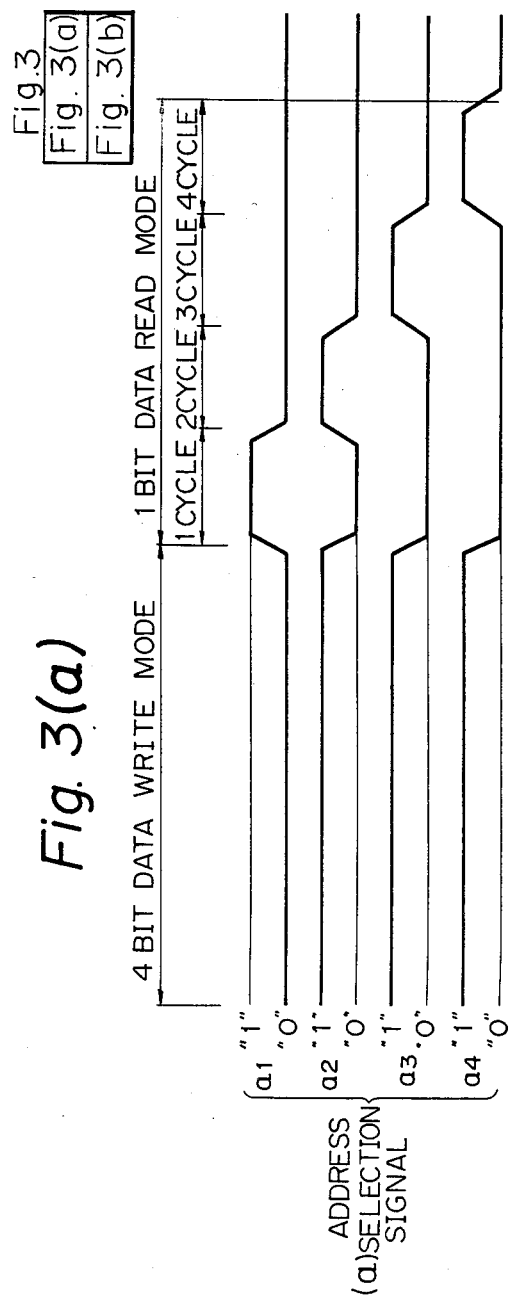

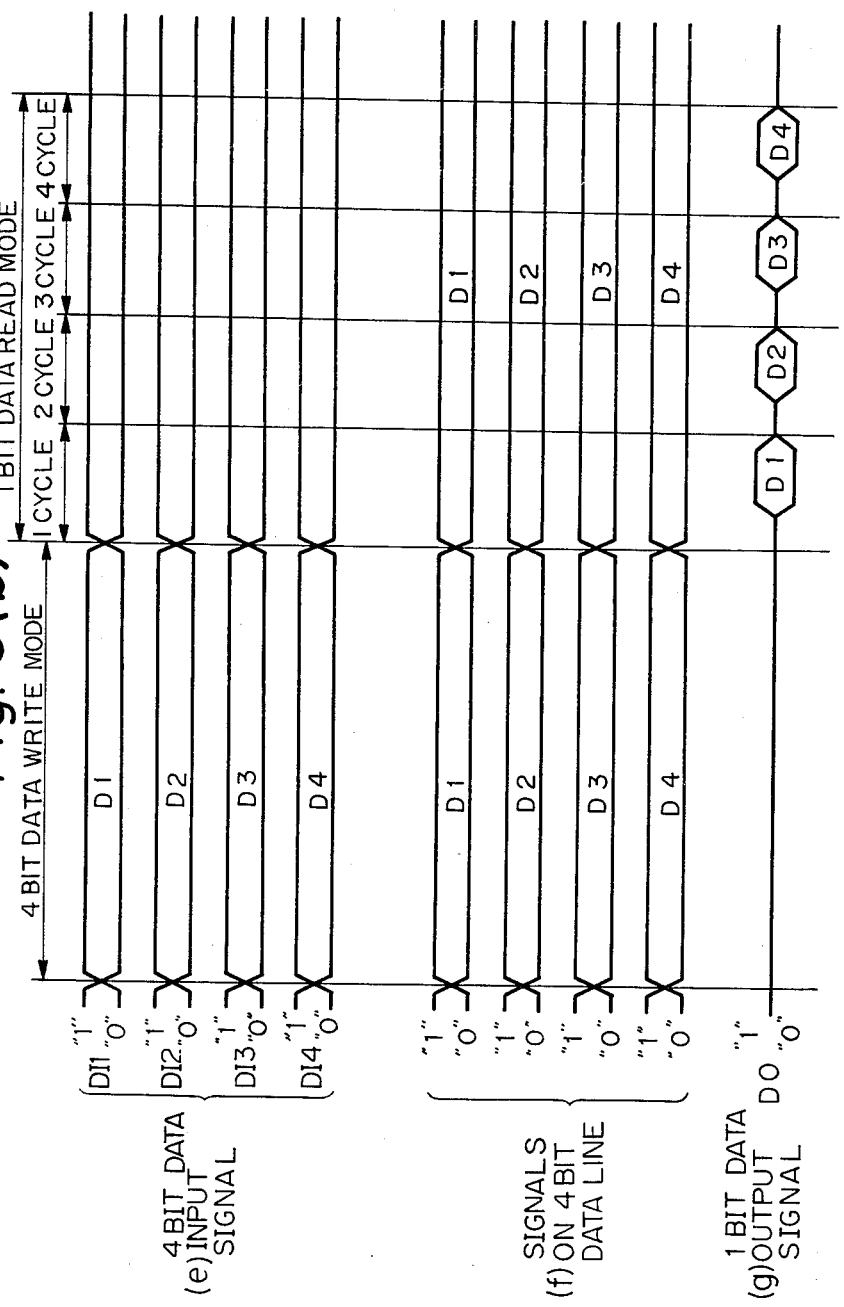

SEMICONDUCTOR RANDOM ACCESS MEMORY DEVICE HAVING SWITCHABLE INPUT AND OUTPUT BIT FORMS

BACKGROUND OF THE INVENTION

1. Field of the Invention

The present invention relates to a large memory capacity semiconductor random access memory (RAM) device.

2. Description of the Prior Art

Recent progress of the semiconductor technology has made it possible to manufacture large memory capacity IC devices such as 1 M-bit dynamic RAMs, 4 M-bit dynamic RAMs and the like.

A semiconductor RAM IC has been generally constructed so as to perform its read/write operation with the input/output data having the same number of bits.

Generally, the memory functional test has been performed by sequentially reading out 1-bit information units from each memory cell of an internal memory matrix.

However, with an increase in the memory capacity of a memory IC device, a large amount of test time has been required to test the condition of all of the memory cells in the memory matrix. This problem is particularly significant in a large capacity memory in a 1-bit configuration comprising a pair of input and output data units.

The minimum test time Tmin (write time + read time) which is needed to test the conditions of all of the memory cells by reading out bit information units from each memory cell of a memory cell matrix one bit at a time is given by the following formula:

$$T_1 = (Tw + Tr) * N * n \quad (1)$$

where Tw is a write time needed for a 1-bit information unit, Tr is a read time needed for a 1-bit information unit, N is the number of bits and n is the number of test patterns.

As seen from the formula (1), the test time increases in proportion to the memory capacity (in terms of the number of bits).

The $N^{3/2}$ or $N^2$ testing method which takes into account effects to the peripheral memory cells about a memory cell to be tested is commonly performed but it requires a longer test time.

In order to shorten the test time of large capacity memory devices, a memory configuration is known which comprises a plurality of pairs of output data terminals and a pair of input data terminals, and can read out a 1-bit memory cell information unit as a memory cell information unit in a multi-bit form by means of a control signal. This memory configuration, for example, is described in detail in the paper titled "MEGA-BIT DRAM S" in the ISSCC 85 DIGEST OF THE TECHNICAL PAPERS, pages 288, 239 and 352.

In such a memory circuit arrangement which, for example, can read out 4-bit information units at the same time, the minimum test time $T_2$ is as follows:

$$T_2 = (Tw + \tfrac{1}{4}Tr) * N * n \quad (2)$$

As a result, the read time $T_r$ is reduced by a factor of 4 so as to provide an improved test time.

However, the prior art memory circuit arrangement is not able to decrease the writing time for 1-bit data units in order to improve the test time sufficiently.

In addition, since the prior art memory arrangement has a multi-bit data terminal for receiving an address selection signal, an additional signal switching circuit is required which can switch from an address selection signal to a data output signal at a high speed to input it to the memory circuit when a memory testing apparatus performs a memory reading test. This results in a complicated testing method.

Furthermore, since the multi-bit data input/output terminal shares the address selection input terminal, the parasitic capacitance at the input terminal is increased and results in a delayed addressing time.

SUMMARY OF THE INVENTION

In view of the drawbacks of the prior art semiconductor random access memory, it is an object of the present invention to provide a semiconductor random access memory enabling of greatly reducing the memory test time.

Another object of the present invention is to provide a semiconductor random access memory capable of arbitrarily selecting the combination of a 1-bit information reading/writing operation and a multi-bit information reading/writing operation.

Still another object of the present invention is to provide a semiconductor random access memory capable of changing its input/output function by a simple operation.

To achieve the above objects, a semiconductor RAM device according to the present invention comprises:

(a) a memory cell matrix connected to a plurality of pairs of data lines and including a plurality of memory cells;

(b) an address decoder circuit responsive to an external address signal for receiving an address selection signal;

(c) a plurality of data input control circuits, each of which has a first input for receiving a 1-bit data signal in response to a 1-data input control signal and to an address selection signal, and has a second input for receiving a one-bit signal of the multi-bit data in response to a multi-bit data control signal and has an output for selectively providing, as a pair of complementary signals, the 1-bit data signal or the one-bit signal of the multi-bit data signal to a pair of data lines in response to a read/write control signal;

(d) a plurality of data input/output switching circuits, each of which is connected to said pair of data lines for selectively transmitting said pair of complementary signals on said pair of data lines to the output thereof in response to the read/write control signal;

(e) a plurality of bit data output control circuits, each of which is connected to the output of the respective data input/output switching circuit, and provides the pair of signals on said pair of data lines in response to both the address selection signal and to the 1-bit data input control signal;

(f) a 1-bit data output circuit connected to the plurality of the bit data output control circuits for outputting 1-bit data in response to the outputs from a selected one of the plurality of bit data output control circuits; and (g) a plurality of bit signal output control circuits, each of which is connected to the output of the respective data input/output switching circuit for providing a one-bit signal of the multi-bit in response to the multi-bit data input control signal.

The above and other objects, features and advantages of the present invention will be apparent from the following description when taken in conjunction with the accompanying drawings in which a preferred embodiment of the present invention is shown by way of illustrative examples.

BRIEF DESCRIPTION OF THE DRAWINGS

FIG. 2, consisting of FIGS. 2(a) and 2(b), is a timing chart illustrating a 1-bit data writing mode and 4-bit data reading mode of the embodiment of FIG. 1; and FIG. 3, consisting of FIGS. 3(a) and 3(b), is a timing chart illustrating a 4-bit data writing mode and 1-bit data reading mode of the embodiment shown in FIG. 1.

DESCRIPTION OF THE PREFERRED EMBODIMENT

Operation of an embodiment of a semiconductor RAM IC device according to the present invention will be described in detail with reference to FIG. 1.

Figure 1B:
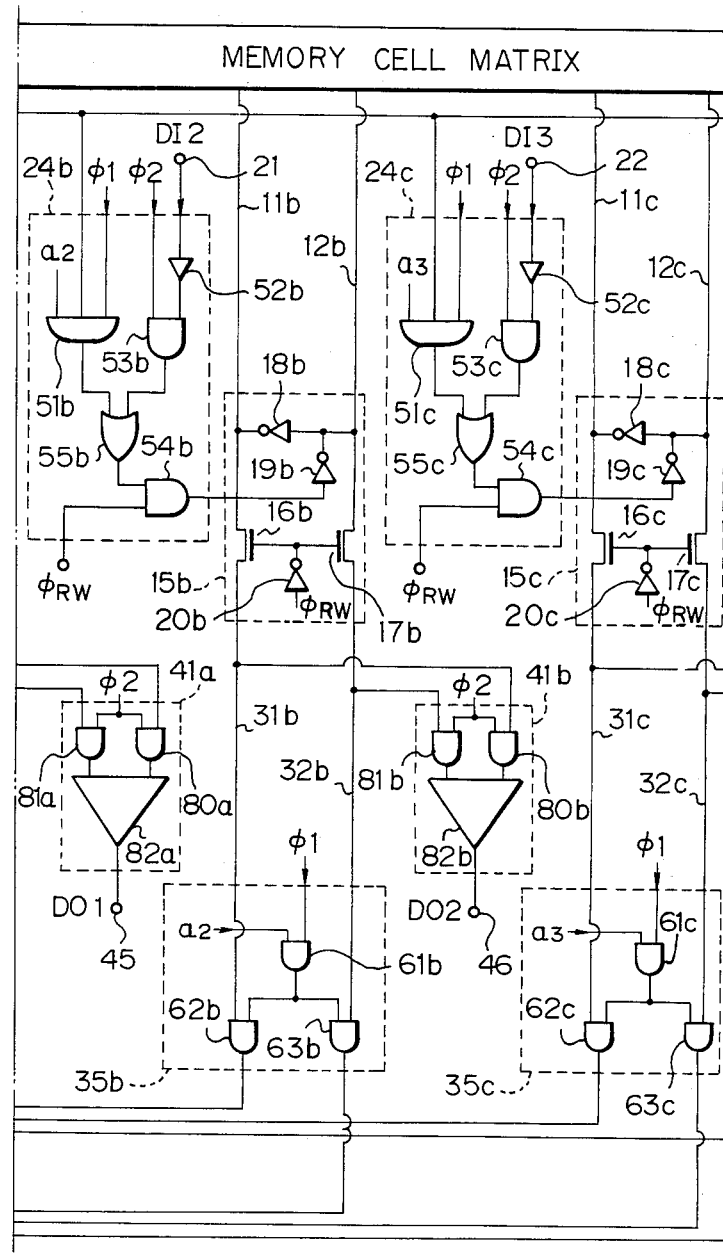
FIG. 1, consisting of FIGS. 1(a), 1(b) and 1(c), is a logic diagram showing an embodiment of a semiconductor RAM device according to the present invention.
Figure 1C:
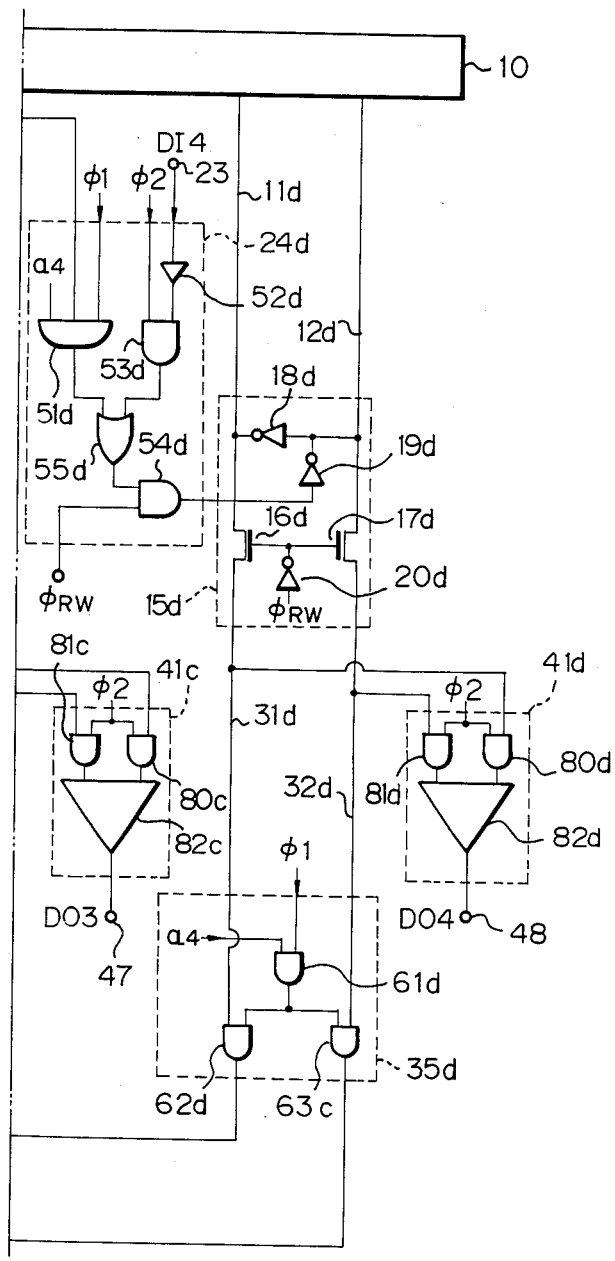

In FIGS. 1(a)–1(c), an embodiment of a MOS RAM circuit is capable of selectively switching its input and output bit forms from a 1-bit input/output×M words arrangement to a 4-bit input/output×M/4 words arrangement by a control signal.

The MOS RAM circuit of the present invention has a memory matrix 10 including a plurality of memory cells, a plurality of data input/output switching circuits 15 respectively connected to a plurality of a pair of data lines 11, 12 and 31, 32, a data input circuit composed of a plurality of data input control circuits 24 and an address decoder 34.

In addition, the MOS DRAM circuit of the present invention has a 1-bit data selection circuit composed of a plurality of bit data output control circuits 35, a 1-bit data output circuit 39, a 4-bit data output circuit composed of a plurality of bit signal output control circuits 41.

The memory cell matrix 10 has a plurality of memory cells, each storing 1-bit information, and data amplifiers (not shown) for transmitting and controlling 1-bit information between the memory cells and the data lines 11 and 12.

The data input/output switching circuit 15 is interposed between a pair of data lines 11 and 12, and a pair of data lines 31 and 32, an inverter 20 connected to the gates of MOS transistors 16 and 17 to control the MOS transistors 16 and 17 on the basis upon a read/write control signal φRW, and inverters 18 and 19 to convert a bit signal to a pair of complementary signals and to deliver them to a pair of data lines 11 and 12.

The address decoder 34 decodes a part of an external address data to designate addresses of the memory cells divided into four groups in the memory cell matrix 10, and delivers address selection signal a1 and a4.

The data input control circuit 24 has an AND gate 51 for receiving an address selection signal a, an 1-bit data signal D10, and an 1-bit data input control signal φ1, an AND gate 53 for receiving a multi-bit data input control signal φ2, and a 1-bit signal DI of 4-bit data inputted via the buffer 52, an OR gate 55 for receiving output signals from the AND gates 51 and 53, and an AND gate 54 for selectively transmitting an output from OR gate 55 to the inverter 19 of the data input/output switching circuit 15 on the basis of a read/write signal φRW.

The bit signal output control circuit 41 has an AND gate 80 for receiving a multi-bit data input control signal φ2, and a bit signal from the data line 31, and AND gate 81 for receiving a control signal φ2 and a bit signal from the data line 32, and an amplifier circuit 82 for amplifying output signals from the AND gates 80 and 81 and delivering them to the output terminals 45 and 48.

The bit data output control circuit 35 has an AND gate 61 for receiving an address selection signal a and a 1-bit data input control signal φ1, an AND gate 62 for receiving a signal from the data line 31, and an output signal from the AND gate 61, and an AND gate 63 for receiving signals from the data line 32 and the AND gate 61.

The 1-bit data output circuit 39 is connected to respective output nodes of the bit data output control circuits 35a, 35b, 35c, and 35d of the 1-bit data selection circuit and comprises a set of NOR gates 70 and 71 for delivering complementary output signals from a bit data output control circuit selected by an address selection signal a, and an amplifier circuit 72 for amplifying the outputs from the NOR gates 70 and 71 and then delivering them to the terminal 40 as 1-bit data signal DO.

In succession, a read/write operation of the RAM device according to the present invention will be described with reference to FIGS. 2(a)–2(b) and 3(a)–3(b).

As shown in the waveforms (b), (c) and (d) of FIG. 2(a), when a logic "1" 1-bit data input control signal φ1 and a logic "0" multi-bit data input control signal φ2 occur, the device operates in a 1-bit data write mode.

In one cycle of the write mode, the address decoder 34 selects, for example, an output line a1 on the basis upon an external address signal SEA and delivers a logic "1" address selection signal.

Then, as shown in the waveforms (e) of FIG. 2(a), when a 1-bit data D1 is inputted into the data input terminal 33, only an AND gate 51a is selected to deliver the 1-bit data D1, since an address selection signal on the output line a1 is at a "1" logic level. At the same time, since the AND gates 53a, 53b, 53c and 53d receive a "0" level control signal φ2, the transmission of bit signals D1, D2, D3, and D4 of the multi-bit data is prohibited.

An OR gate 55a of the data input control circuit 24 hereby selected provides a 1-bit data signal D1 to the gate 19a via an AND gate 54a.

The 1-bit data signal D1 is converted by the gates 18a and 19a of the input/output data switching circuit 15a into complementary signals, and transmitted to data lines 11a and 12a, as shown by the waveform (f) in FIG. 2(b).

Since the transistors 16a and 17a of the input/output data switching circuit 15a are in an off state, the 1-bit data on the data lines 11a and 12a are written into a selected memory cell in the memory cell matrix 10.

Then, when an address line a2 of the address decoder 34 is selected in a second cycle of the 1-bit data writing mode and a logic "1" address selection signal is delivered, an AND gate 51b of the data input circuit 24b provides a 1-bit data D2.

By contrast, AND gate 53b, since the "0" level control signal φ2 is inputted thereto, prohibits the transmission of a bit signal D2 in the multi-bit data.

Therefore, an OR gate 55b delivers the 1-bit data signal D2 via the AND gate 54b.

The 1-bit data signal D2 is converted through the gates 18a and 19b of the data input/output switching circuit 15b to complementary signals, and transmitted to data lines 11b and 12b, as shown by the waveform (f) in FIG. 2(b).

Since transistors 16b and 17b of the data input/output switching circuit 15b remain in an off state, the 1-bit data D2 on the data lines 11b and 12b are written in a selected memory cell in the memory cell matrix 10.

Likewise, in a third cycle, when an output line a3 of the address decoder 34 is at a "1" logic level, a 1-bit data D3 is delivered to a data input/output switching circuit 15c via a data input circuit 24c. The 1-bit data D3 is converted to complementary signals via the gates 18c and 19c, provided to the data lines 11c and 12c and then written in a memory cell at a selected address in the memory matrix 10.

In addition, in a fourth cycle, when an output line a4 of the address decoder 34 is a logic "1", a 1-bit data D4 is delivered via a data input circuit 24d. The 1-bit data D4 is converted to complementary signals by gates 18d and 19d of the input/output data switching circuit 15d. The complementary signals are delivered on the data lines 11d and 12d, and written in a memory cell at a selected address of the memory matrix 10.

In succession, as shown in the waveforms (b), (c) and (d) of FIGS. 2(a) and (b), when a multi-bit data control signal $\phi 2$ is changed to a "1" logic level, and the 1-bit data control signal $\phi 1$ changed to a "0" logic level, and a R/W control signal $\phi W$ changed to a "0" logic level, the operation of the apparatus changes to a 4-bit data read mode.

Thus, an AND gate 54 of the data input circuit 24 prohibits the 1-bit data DI from being transmitted to the input/output switching circuit 15.

Moreover, the transistors 16 and 16 of the input/output switching circuit 15 conduct due to a "0" logic R/W control signal RW to cause the data lines 11 and 12, which are respectively connected to the data lines 31 and 32, to parallelly transmit information on a memory cell at a selected address of the memory cell matrix 10 to the data line pairs 31a to 31d and 32a to 32d. Since the AND gates 80 and 81 receive a "1" logic control signal $\phi 2$, the bit signal output control circuit 41 provides the bit data on the data line pairs 31 and 32 as a 1-bit signal of 4-bit data.

Thus, the memory cell information provided on the data lines 31 and 32 are simultaneously delivered from output terminals 45, 46, 47, and 48 as 4-bit data DO1 to DO4 as shown by FIGS. 1(a) and 1(b).

As described above, the semiconductor RAM circuit of the present invention can deliver simultaneously parallelly any 1-bit data as multi-bit data.

In succession, a 4-bit data write mode will be described with reference to FIGS. 3(a)-3(b).

When a R/W control signal $\phi RW$ is changed to a logic level "1", and a 1-bit data write control signal $\phi 1$ changed to a "0" logic level, and a 4-bit data write control signal $\phi 2$ changed to a "1" logic level, the operation of the memory device becomes a 4-bit data write mode.

In one cycle of a write mode, the address decoder 34 selects, for example, the output line a, and provides a "1" logic level on the basis of a part of an external address signal.

Bit signals DI1 to DI4 of 4-bit data are provided to the input terminals 20 to 22 of the data input circuits 24 to 27, respectively.

Since the control signal $\phi 1$ is at a "0" logic level, the AND gates 51a to 51d of the data input circuits 24a to 24d do not transmit the 1-bit data DI0.

Since the control signal $\phi 2$ is at a "1" logic level, each bit signal of the 4-bit data is transmitted to the AND gate 54 via the OR gate 55. In addition, since the R/W signal $\phi RW$ is at a "1" logic level, a output signal from the OR gate 55 is provided to the inverter 19a.

The each bit signal of the 4-bit data is converted to complementary signals to transmit to a pair of data lines 11a and 12a.

Thus, respective bit signals of the 4-bit data are transmitted to the respective data line pairs 11 and 12 through the input/output data switching circuit 15a to 15d, and respectively written into memory cells at selected addresses of the memory matrix 10 at the same time.

Next, when the R/W control signal $\phi RW$ is changed to a "0" logic level, and the 1-bit data write control signal $\phi 2$ changed to a "0" logic level, the operation changes to a data read mode.

When the R/W control signal $\phi RW$ is changed to a "1" logic level, the MOS transistors 16 and 17 of the input/output data switching circuit 15 conduct, whereby the pair of bit data lines 11 and 12 of the memory cell matrix 10 are connected to the bit signal output control circuit 41 of the multi-bit data output circuit and to the bit data output control circuit 35.

The bit signal output control circuit 41, since the control signal $\phi 2$ is at a "0" logic level, prohibits a signal the data line pairs 31 and 32 from being transmitted.

In a first cycle of a data read mode, the bit signal control circuits 35a to 35d are selected by an address selection signal a from the decoder circuit 34. For example, when the output line a1 is changed to a "1" logic level, the bit control circuit 35a delivers complementary signals of the signal on a pair of data lines and a 1-bit data output circuit 3a provides an output bit signal to the output terminal 40 as 1-bit data DO.

In succession, in a second cycle, when an output line a2 of the decoder circuit 34 is changed to a "1" logic level, the bit signal control circuit 35b is selected.

The control circuit 35b delivers memory cell information on a pair of data lines 31b and 32b to the 1-bit data output circuit 39.

Accordingly, the 1-bit data output circuit 39 serially provides the 1-bit data D2 to the 1-bit data D1.

Likewise, as shown in FIG. 3(b), 1-bit data D3 and D4 are sequentially delivered to the output terminal 40 (FIG. 1(a)) in accordance with an address selection signal a from the decoder circuit 34.

As described above, according to the present invention, the semiconductor RAM circuit can read multi-bit information at the same time and then deliver it as 1-bit data in succession.

As shown in Table 1, the RAM circuit of the present ivnention is capable of arbitrarily selecting a read operation for 1-bit data or multi-bit data after writing 1-bit data, or a read operation for 1-bit data or multi-bit data after writing multi-bit data in accordance with output control signals $\phi 1$ and $\phi 2$.

TABLE 1

| Case | Control Signal | | | |
|---|---|---|---|---|
| | $\phi 1$ | $\phi 2$ | $\phi RW$ | |
| | | | | Write Mode |
| 1 | 1 | 0 | 1 | 1-bit data read mode |

TABLE 1-continued

| Case | Control Signal | | | |
|---|---|---|---|---|
| | φ1 | φ2 | φRW | |
| 2 | 0 | 1 | 1 | 1-bit data write mode |
| | | | | Read Mode |
| 1 | 1 | 0 | 0 | 1-bit data read mode |
| 2 | 0 | 1 | 0 | 4-bit data read mode |

As shown in a case 2 of Table 1, when the RAM circuit of the present invention is operated in a 4-bit data write and read modes, the time for accessing any data from the memory cell matrix is reduced by a factor of 4, whereby the test time for a memory can be remarkably shortened.

According to the RAM circuit of the present invention, 1-bit or 4-bit data can be readily controlled in their input/output operation by the control signals φ1 and φ2. Accordingly, when the control signal φ1 or φ2 are held at a prescribed logical level, RAM ICs having different functions can be provided without altering a circuit pattern of a photomask and a wafer process. Therefore, the number of a RAM device family can be increased with ease.

When an exclusive pin terminal on a RAM is provided to the control signals φ1 and φ2, users can easily and arbitrarily realize any combination of desired data write and read modes.

The semiconductor RAM device according to the present invention can be very effectively applied to a large-scale semiconductor DRAM IC having, in particular, 1-mega bit memory capacity or more.

What is claimed is:

1. A semiconductor random access memory device having input terminals for receiving multi-bit data and output terminals for transmitting multi-bit data, comprising:
   (a) a memory cell matrix connected to a plurality of pairs of data lines and including a plurality of memory cells;
   (b) an address decoder circuit responsive to an external address signal for providing address selection signals;
   (c) a plurality of data input control circuits, each of which has a first input for receiving a 1-bit data signal in response to a 1-bit data input control signal and to an address selection signal, and has a second input for receiving a one-bit signal of said multi-bit data signal in response to a multi-bit data input control signal and has an output for selectively providing, as a pair of complementary signals, said 1-bit data signal or said one bit signal of said multi-bit data signal to a respective pair of data lines in response to a read/write control signal;
   (d) a plurality of data input/output switching circuits, each of which is connected to an associated pair of data lines for selectively transmitting the pair of complementary signals on said associated pair of data lines to an output thereof in response to said read/write control signal;
   (e) a plurality of bit data output control circuits, each of which is connected to the output of a respective data input/output switching circuit, and provides the pair of signals from said respective data input/output switching circuits in response to both an address selection signal and to said 1-bit data input control signal;
   (f) a 1-bit data output circuit connected to said plurality of said bit data output control circuits for outputting 1-bit data in response to bit data from a pair of selected data lines; and
   (g) a plurality of bit signal output control circuits, each of which is connected to the output of a respective data input/output switching circuit for providing a one bit signal of said multi-bit data in response to said multi-bit data input control signal.

2. A semiconductor access memory device according to claim 1, wherein of said data input/output switching circuits comprises a pair of MOS transistors, one of said pair of MOS transistors having a first electrode connected to one of said data lines, a second electrode connected to a first input of a respective bit data output control circuit, and a gate electrode for receiving said read/write control signal, and the other of said pair of MOS transistors having a first electrode connected to the complementary data line of said one of said data lines, a second electrode connected to a second input of said respective bit data output control circuit, and a gate electrode for receiving said read/write control signal.

3. A semiconductor access memory device according to claim 1, wherein each of said data input control circuits comprises a first AND gate having an output connected to a respective data input/output switching circuits, a first input, and a second input for receiving said read/write control signal; an OR gate circuit having a first input, a second input, and an output connected to said first input of said first AND gate circuit; a second AND gate having a first input for receiving said multi-bit data input control signal, an output connected to said first input of said NOR gate and a second input for receiving a one bit signal of said multi-bit data; and a third AND gate having a first input for receiving one of said address selection signals from said address decoder circuit, a second input for receiving said 1-bit data signal, and a third input for receiving said 1-bit data input control signal.

4. A semiconductor access memory device according to claim 1, wherein each of said bit signal output control circuits comprises a first AND gate having a first input connected to one of a respective outputs of said data input/output switching circuit, a second input for receiving said multi-bit data control signal, and an output; a second AND gate having a first input connected to the complementary output of said respective data input/output switching circuit, a second input for receiving said multi-bit data control signal, and an output; an amplifier circuit having a first input connected to said output of said first AND gate, a second input connected to said output of said second AND gate, and an output; and wherein each of said bit data output control circuits comprises a first AND gate having a first input for receiving one of said address selection signals from said address decoder circuit, a second input for receiving said 1-bit data input control signal, and an output; a second AND gate having a first input connected to said output of said first AND gate, and a second input connected to one of the outputs of a respective data input/output switching circuit, and an output connected to said 1-data output circuit; and a third AND gate having a first input connected to the complementary output of said one of said outputs of said respective data input/output switching circuit, a second input connected to said output of said first AND gate, and an output connected to said 1-bit data output circuit.

5. A semiconductor access memory device according to claim 1, wherein the first input of a respective data input control circuit is held at a first logic level, and said second input of said respective data input control circuit is held at a second logic level, whereby one of either a multi-bit data writing operation and multi-bit read operation is performed, or a 1-bit data writing operation and a 1-bit read operation is performed.

* * * * *